Figure 1:
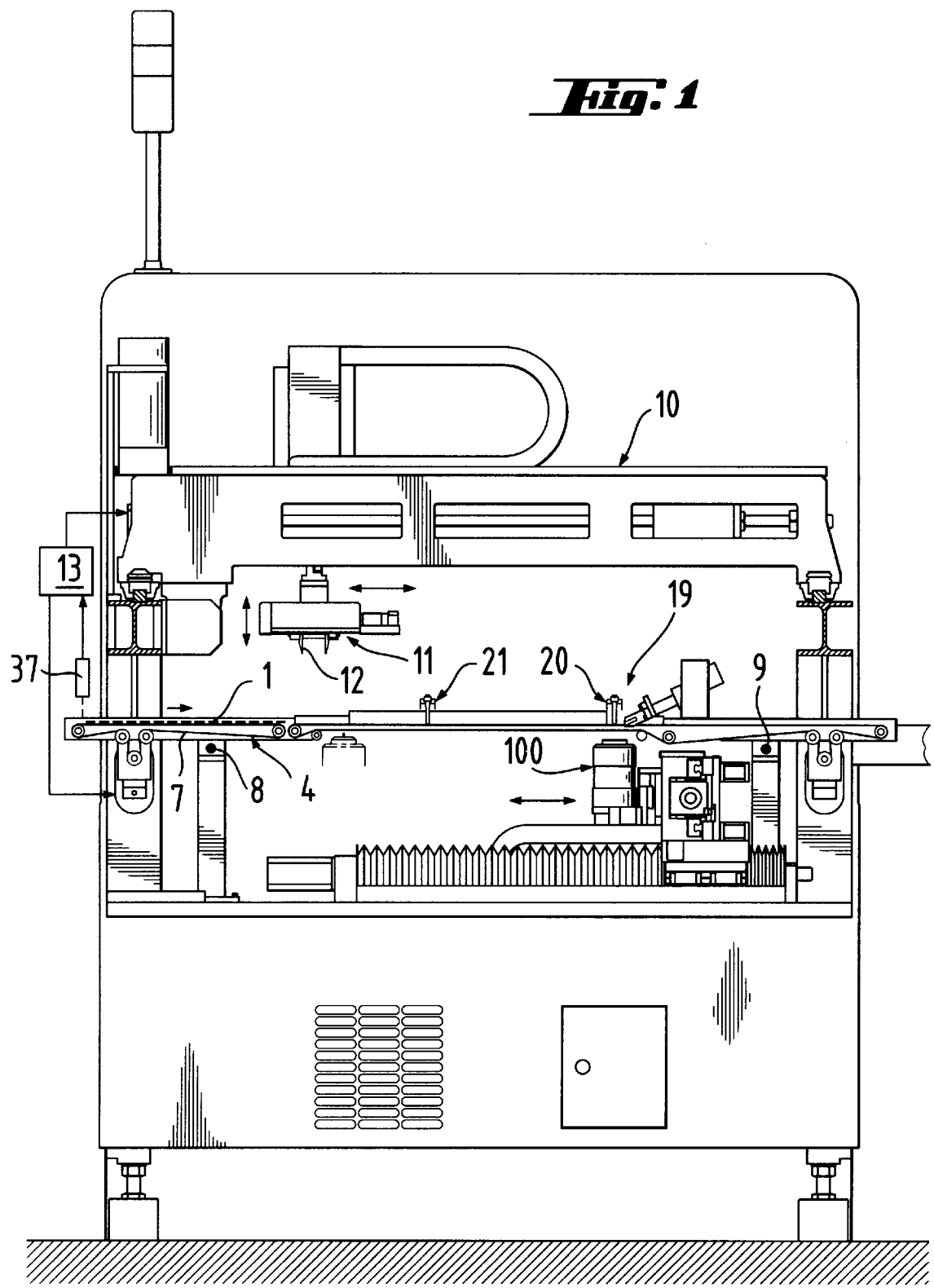

United States Patent [19]
Jokela

[11] Patent Number: 5,873,155
[45] Date of Patent: Feb. 23, 1999

[54] APPARATUS FOR AUTOMATIC FABRICATION OF CIRCUIT BOARDS

[75] Inventor: Markku Jokela, Virkkala, Finland

[73] Assignee: PMJ Automec Oy, Virkkala, Finland

[21] Appl. No.: 850,158

[22] Filed: May 2, 1997

[30] Foreign Application Priority Data

May 6, 1996 [FI] Finland ..................................... 961918

[51] Int. Cl.$^6$ .................................................. B23Q 7/00
[52] U.S. Cl. ............................ 29/33 P; 29/740; 198/414; 198/817
[58] Field of Search .................................... 29/33 P, 714, 29/740, 711, 712, 563; 198/817, 414, 345.3, 803.14, 626.1, 404; 228/212

[56] References Cited

U.S. PATENT DOCUMENTS

| | | | |
|---|---|---|---|
| 4,561,819 | 12/1985 | Wiernicki | 198/345.3 X |
| 4,631,812 | 12/1986 | Young | 29/714 |
| 4,840,268 | 6/1989 | Zemek | 198/817 |
| 5,009,306 | 4/1991 | Roderick et al. | 198/414 |
| 5,029,696 | 7/1991 | Van Tilburg | 198/626.1 |
| 5,113,701 | 5/1992 | Martin | 198/803.14 X |
| 5,208,975 | 5/1993 | Hidese | 29/740 X |
| 5,242,096 | 9/1993 | Tsunabuchi | 228/212 X |
| 5,628,112 | 5/1997 | Maslar et al. | 29/711 X |
| 5,637,148 | 6/1997 | Kuster et al. | 198/404 X |
| 5,707,052 | 1/1998 | Adams et al. | 269/903 X |

FOREIGN PATENT DOCUMENTS

WO 91/11093  7/1991  WIPO.

*Primary Examiner*—William Briggs
*Attorney, Agent, or Firm*—Merchant, Gould, Smith, Edell, Welter & Schmidt

[57] ABSTRACT

Apparatus for automatic execution of operations in the fabrication of circuit boards or similar boards. The apparatus comprises a conveyor (4) consisting of two parallel conveyor halves (5, 6) provided with a traction element (7) to convey the circuit board. The conveyor halves, guided by a first set of guide bars (8, 9), can be moved in a direction transverse to the conveying direction while remaining parallel to each other, to permit adjustment of the width of the conveyor; a 3-D transfer gear (10) disposed above the conveyor (4) and provided with a gripper (11). The apparatus is provided with tools (12) which can be manipulated by the gripper (11) of the transfer gear, and a control unit (13). The apparatus comprises a first set of locking elements (14) to lock the conveyor half (5, 6) in position relative to the first guide bars (8, 9), and, correspondingly, to release them, according to a specified code run by the control unit (13); a transferring tool (15) arranged to be manipulated by the gripper (11) of the transfer gear in accordance with the specified code run by the control unit (13); and a lug element (16) provided in the conveyor half (5, 6) and fitted to be gripped by the transferring tool (15) to move the conveyor half to a position defined by the specified code run by the control unit (13) so as to adapt the conveyor to the width (L) of the circuit board.

10 Claims, 11 Drawing Sheets

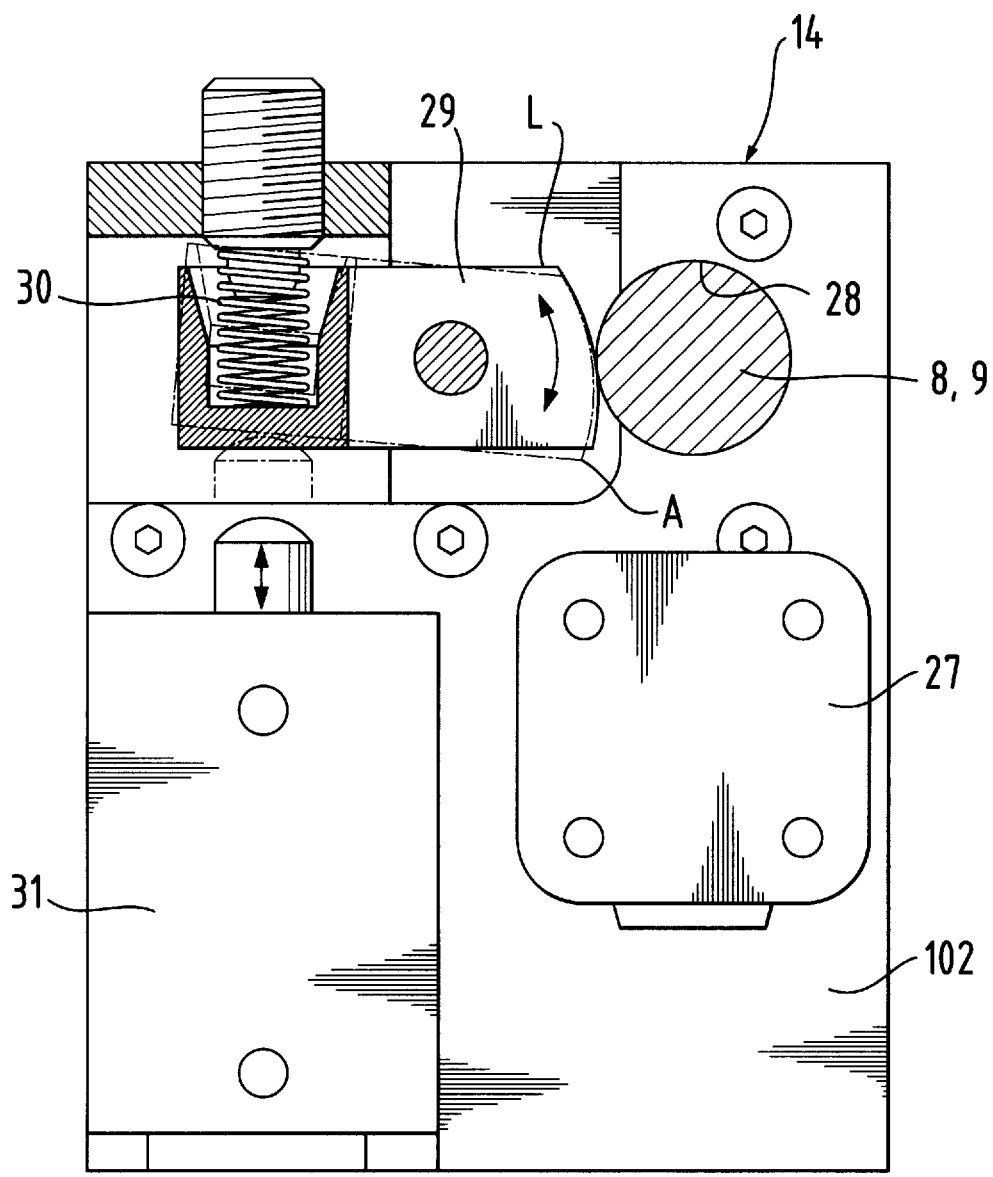

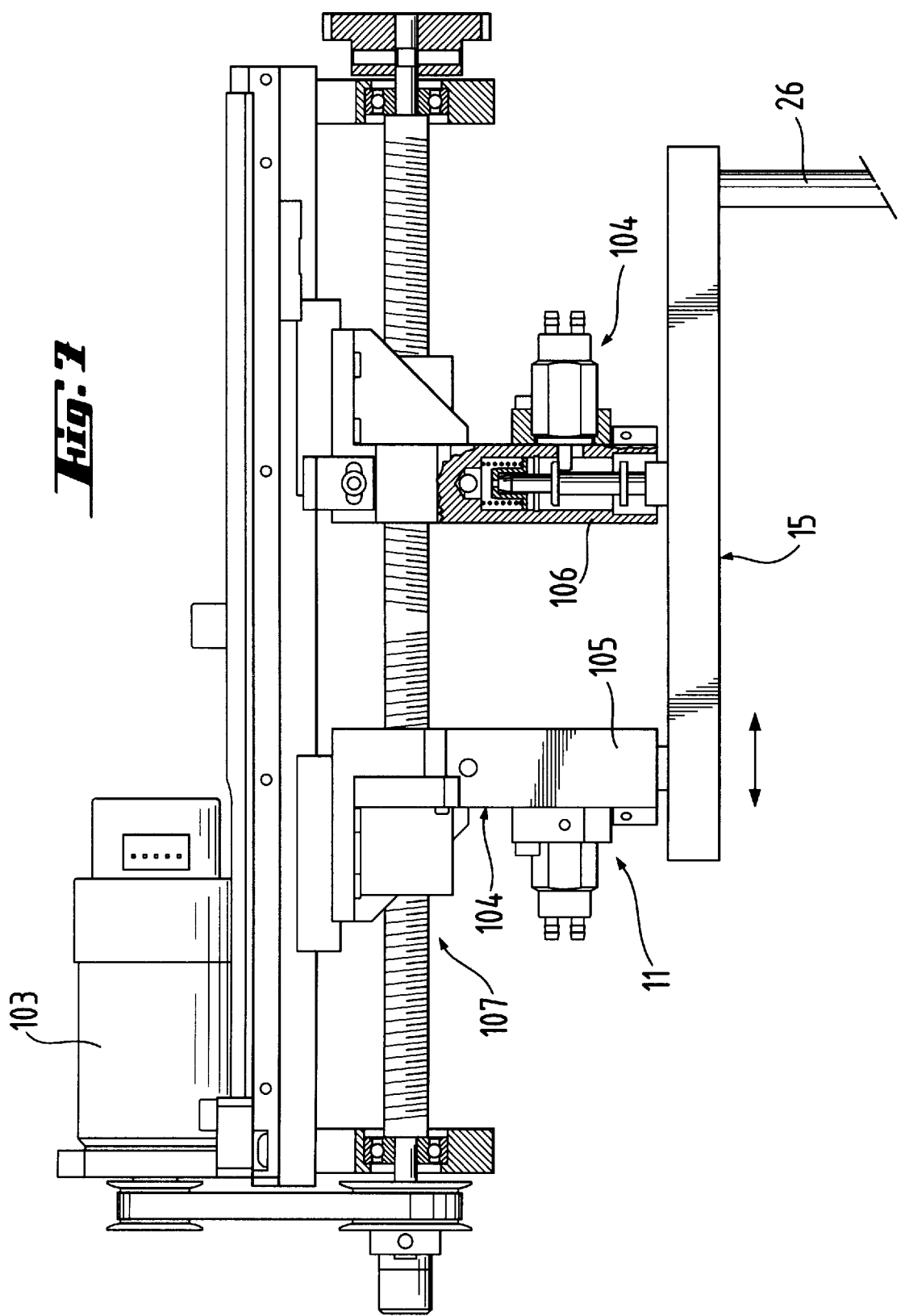

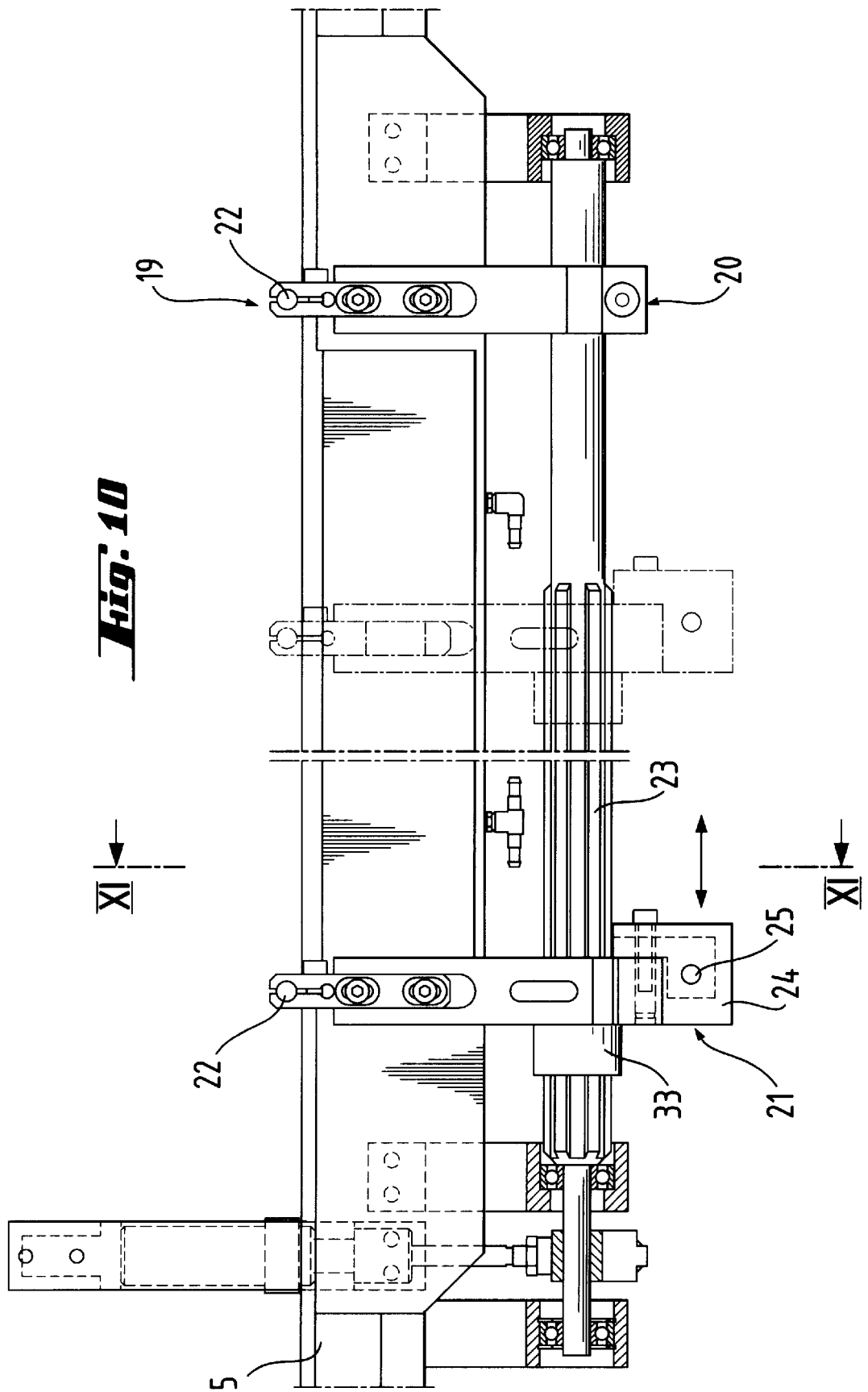

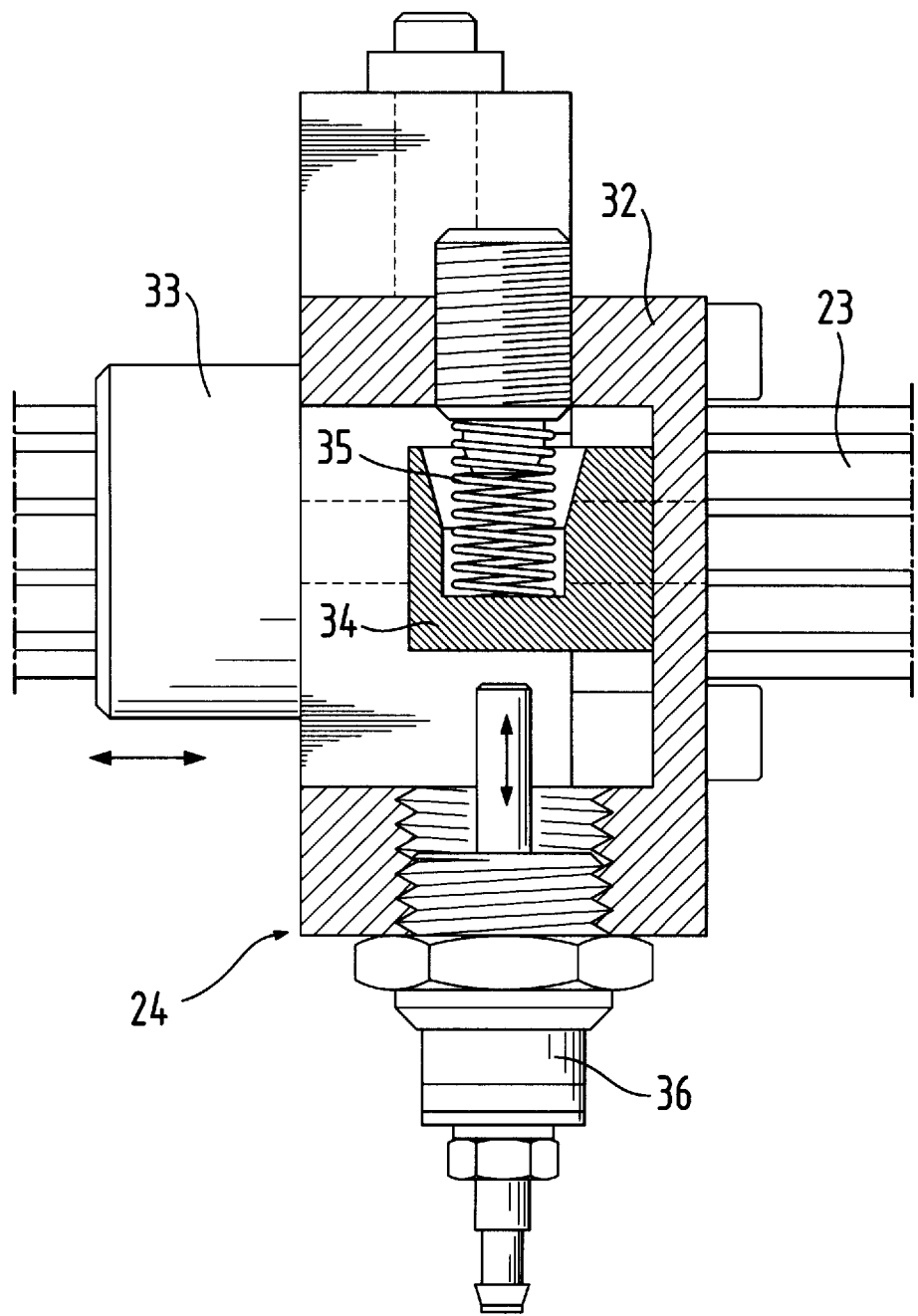

APPARATUS FOR AUTOMATIC FABRICATION OF CIRCUIT BOARDS

The present invention relates to an apparatus for fabricating circuit boards. In particular, the invention relates to an automatic robot cell in which circuit boards brought into the cell by a conveyor are processed.

The apparatus of the invention can be used to automatically carry out various fabrication operations on circuit boards or tile like in accordance with a specified program. Typical tasks performed by so-called robot cells of this type include e.g. the milling of circuit boards, placement of components, pinning of components, and soldering of components onto circuit boards.

The circuit board to be processed comprises two opposite edges parallel to each other, defining the transverse width of the circuit board. Moreover, the apparatus comprises a conveyor consisting of two parallel conveyor halves laid in the conveying direction of the conveyor, each provided with an endless traction element, such as a belt, which is in tractive contact with an edge of the circuit board to move the circuit board. Thus, the circuit board is only supported by its edges on the conveyor. Guided by transverse guide bars, the conveyor halves can be moved in a direction transverse to the conveying direction while remaining parallel to each other, the width of the conveyor being thus adjustable.

Disposed above the conveyor is an automatic 3-D transfer gear, e.g. a so-called xyz-portal robot. The main function of the robot is to process the circuit boards and to carry out one or more of the fabrication operations referred to. The transfer gear comprises a gripper and a variety of tools which can be gripped by the gripper of the transfer gear to perform e.g. fabrication operations on the circuit board as mentioned above.

The functions of the entire cell and the equipment belonging to it, such as the conveyor and the robot, are controlled by a control unit, such as a computer, in accordance with a specified code, such as a computer program.

In such an apparatus, adjustment of the conveyor width is required between different manufacturing lots because the width of the circuit board is usually different for manufacturing lots corresponding to different products. When the product is changed, the width of the conveyor line must be adjusted accordingly. In the course of a working day, the conveyor line width needs to be adjusted e.g. at hourly intervals or even more frequently.

In prior art, the conveyor line width is adjusted manually or using a servomotor by turning a drive screw/nut mechanism, such as a ball screw/nut mechanism, causing one or both of the conveyor halves to move in relation to each other. There may be two ball screws at a distance from each other to move both ends of the conveyor halves simultaneously. One of the screws is turned and the motion is transmitted to the other one e.g. via a chain transmission, The ball screw is rotated manually by means of a crank provided at its end. When a servomotor is used, the ball screw is rotated by the motor.

A problem with prior art apparatus is that, to allow the conveyor width to be adjusted manually, the call needs to be shut down to ensure job safety each time a product change requiring width adjustment occurs. In addition, manual adjustment is slow and requires the use of human labor. Motor operated adjustment requires an electric motor together with an appropriate control system, which again requires expensive components.

The object of the invention is to eliminate the drawbacks mentioned above.

A specific object of the invention is to produce an apparatus in which the adjustment of the conveyor width is implemented by making use of the transfer gear already existing in the apparatus as well as the existing control unit and its programmability.

A further object of the invention is to produce an apparatus in which the adjustment of the conveyor width to match different circuit board sizes can be effected via software quickly and flexibly without a need to shut down the apparatus for the time of the adjustment or to provide the apparatus with expensive additional components.

The apparatus of the invention is characterized by what is presented in claim 1.

The apparatus of the invention comprises a conveyor comprising two conveyor halves parallel to each other and laid in the conveying direction of the conveyor, each half being provided with an endless traction element, such as a belt, which is in tractive contact with the edges of the circuit board to convey the circuit board, which conveyor halves, guided by a first set of guide bars, can be moved in a direction transverse to the conveying direction while remaining parallel to each other to adjust the width of the conveyor. Furthermore, the apparatus comprises an automatic three-dimensional transfer gear, such as a robot, which is disposed above the conveyor to handle the circuit boards and/or to perform fabrication operations, said transfer gear being provided with a gripper. Moreover, the apparatus comprises tools which can be automatically gripped and manipulated by the gripper of then transfer gear. Further, the apparatus comprises a control unit, such as a computer, to control the functions of the equipment belonging to the apparatus, such as the conveyor and the transfer gear, in accordance with a specified code, such as a computer program.

According to the invention, the apparatus is provided with a first set of locking elements to lock the conveyor halves automatically in position relative to the first set of guide bars, and, correspondingly, to release them, according to a specified code run by the control unit; a transferring tool arranged to be manipulated by the gripper of the transfer gear in accordance with the specified code run by the control unit; and a lug element provided in the conveyor half and fitted to be gripped by the transferring tool to move the conveyor half to a position defined by the specified code run by the control unit so as to adjust the conveyor to a width corresponding to the width of the circuit board.

The apparatus has the advantage that the transfer gear, such as a robot, comprised in tho apparatus, and its precision can be utilized in the adjustment of the distance between the conveyor halves after these have been released from their locking on their guide bars. To carry out this adjustment, the transfer gear can, after gripping a simple transferring tool in its gripper, engage the lug element with the tool and thus move one or both of the conveyor halves to a desired position defined by software running in the control unit, whereupon the conveyor halves can be locked in position by means of the locking elements.

In an embodiment of the apparatus, the circuit board comprises centering elements arranged at a distance from each other in a direction; perpendicular to the widthwise direction of the circuit board; that the apparatus is provided with a centering device for positioning the circuit board in cooperation with the centering elements of the circuit board to keep the circuit board substantially accurately in position in a specified location on the conveyor to allow a fabrication operation to be carried out; and the centering device can be adjusted by means of the transferring tool of the transfer gear in accordance with a specified code run by the control unit to match the distance between the centering elements.

Besides the circuit board width, also the aligning elements, usually holes in circuit boards corresponding to different products, may be laid out in different locations, which is why the centering device also needs to be adjusted. This is done automatically by software using the same transfer gear and the same tool as for the conveyor width adjustment.

In an embodiment of the apparatus, the centering elements of the circuit board are holes going through the board. In this case the centering device also comprises two concentrators which are connected to one of the conveyor halves, each concentrator comprising a pin or the like, movable between two positions, between a rest position, where the pin is above the conveyor at a distance from the level of the circuit board, and a centering position, where the pin is in a centering hole. Furthermore, the centering device comprises a second guide bar, along which the concentrator can be moved in the conveying direction of the conveyor in order to adjust the distance between the concentrator pins so as to make it correspond to the distance between the centering holes in the circuit board. Moreover, the centering device comprises a second set of looking elements, designed to automatically lock the concentrator in position on the second guide bar and, correspondingly, to release it, according to a specified code run by the control unit. In addition, the centering device comprises a second lug element provided in the concentrator and fitted to be gripped with a transferring tool to move the concentrator to a position defined by the specified code run by the control unit to adapt the centering device so as to match the distance between the centering holes in the circuit board.

In an embodiment of the apparatus, the transferring tool is provided with a pin; and the first lug element and/or the second lug element is a cut-out, hole or the like, fitted to receive the end of the pin.

In an embodiment of the apparatus, the first set of locking elements comprises a first lock body, which is attached to a conveyor half and has a first guide element, such as a through hole, to receive a first guide bar. Furthermore, the first set of locking elements comprises a first locking lever pivoted on the first lock body so that it can be turned between two positions, a locking position, where the first locking lever is in locking contact width the first guide bar, and a release position, where the first locking lever is released from the locking contact with the first guide bar. Moreover, the first set of locking elements comprises a first spring, which is fitted to press the first locking lever towards the locking position. In addition, the first set of locking elements comprises a first power means, such as a pressure-medium operated cylinder, e.g. a pneumatic cylinder, which is arranged to be activated according to a specified code run by the control unit so that it will act against the spring force of the first soring to turn the locking lever to the release position to allow the position of the conveyor half and the width of the conveyor to he adjusted.

In an embodiment of the apparatus, the second set of locking elements comprises a second lock body, which is attached to the concentrator and has a second guide element to receive a second guide bar. Furthermore, the second set of locking elements comprises a second locking lever pivoted on the lock body so that it can be turned between two positions, a locking position, where the second locking lever is in locking contact with the second guide bar, and a release position, where the second locking lever is released from locking contact with the second guide bar. Moreover, the second set of locking elements comprises a second spring, which is fitted to press the second locking lever towards the locking position. In addition, the second set of locking elements comprises a second power means, such as a pressure-medium operated cylinder, e.g. a pneumatic cylinder, which is arranged to be activated according to a specified code run by the control unit so that it acts against the spring force of the second spring to turn the locking lever to the release position to allow the position of the conveyor half and the width of the conveyor to be adjusted.

In an embodiment of the apparatus, the apparatus comprises a detector designed to detect the circuit board size and/or the locations of the centering elements of the circuit board and to instruct the control unit to adjust the conveyor width and/or the centering device accordingly. To allow detection, the circuit board may be provided with a mark or code, such as a bar code, to indicate the width of the circuit board and/or the locations of the centering elements, and the detector may be a code reader, such as bar code reader. It is also possible to use a vision system. A camera may be used to record an image of the incoming circuit board, recognize its visual shape and instruct the control unit to carry out a corresponding adjustment of the conveyor and/or the centering device.

In an embodiment of the apparatus, the transfer gear is a so-called portal robot.

In an embodiment of the apparatus, the apparatus is a placement cell in which components are placed on a circuit board; a milling cell in which grooves and/or holes are milled in a circuit board; a soldering cell in which components are soldered onto a circuit board; and/or a pinning cell in which components are pinned onto a circuit board.

Figure 2:
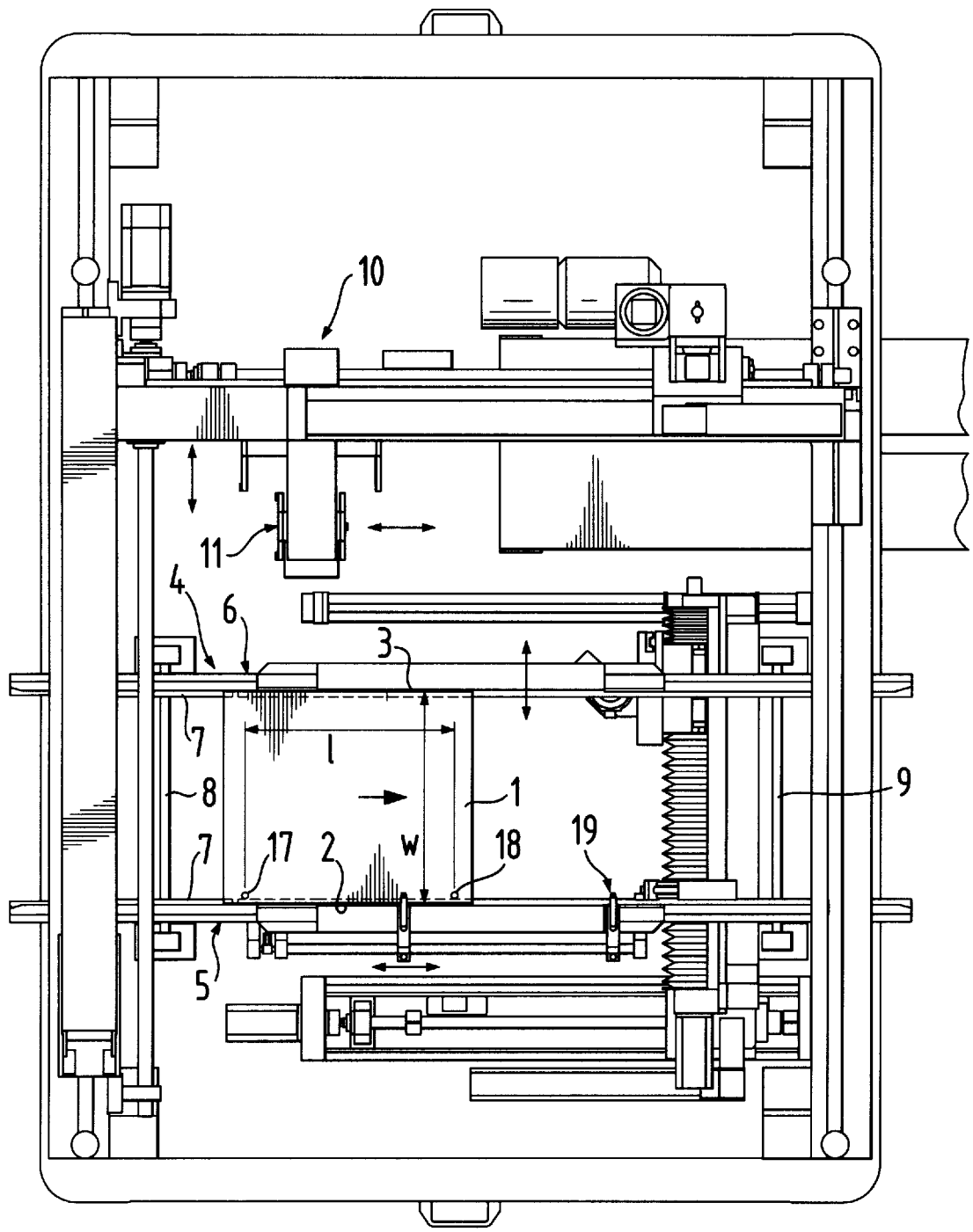
Figure 3:
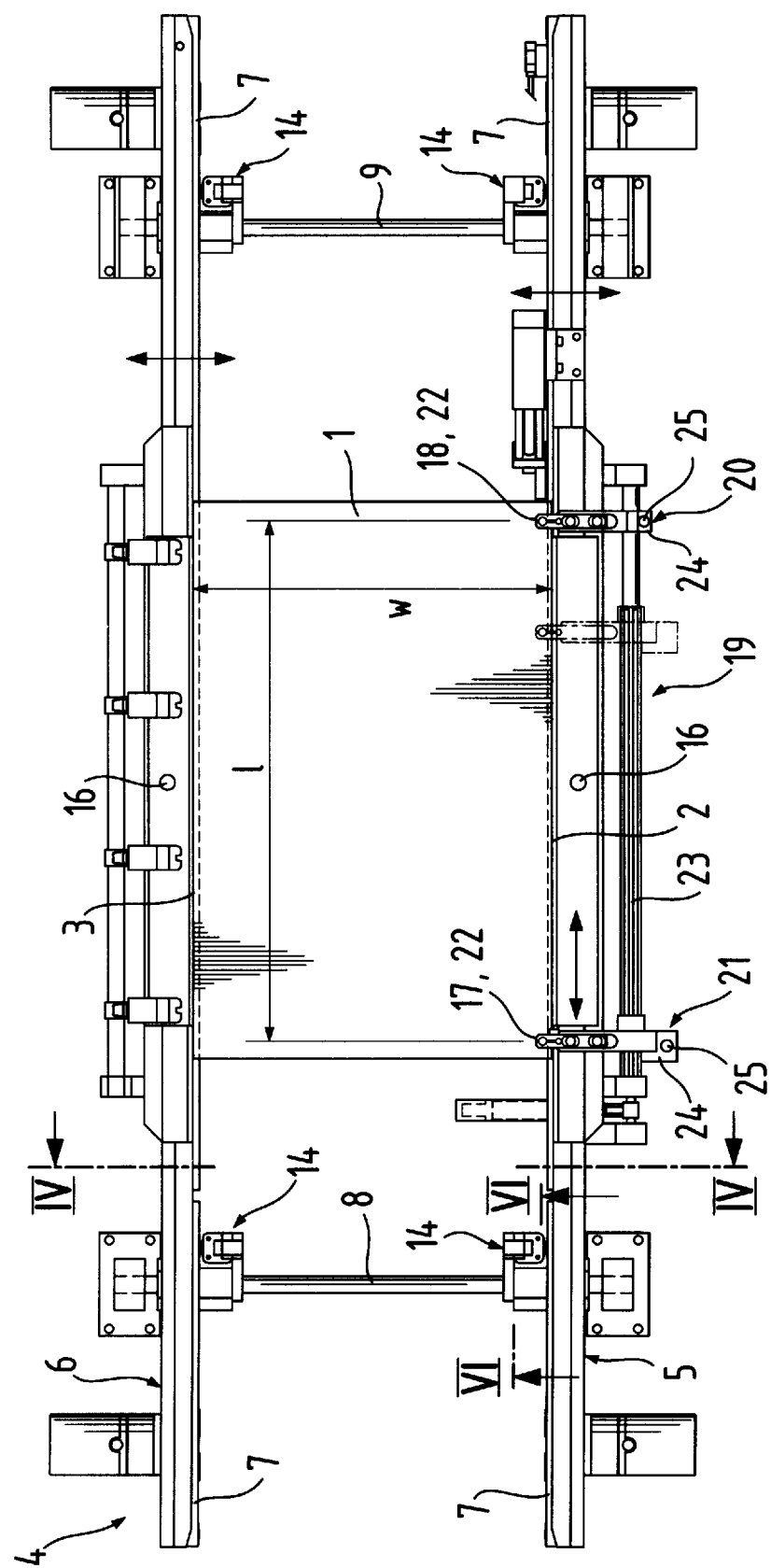
Figure 4:
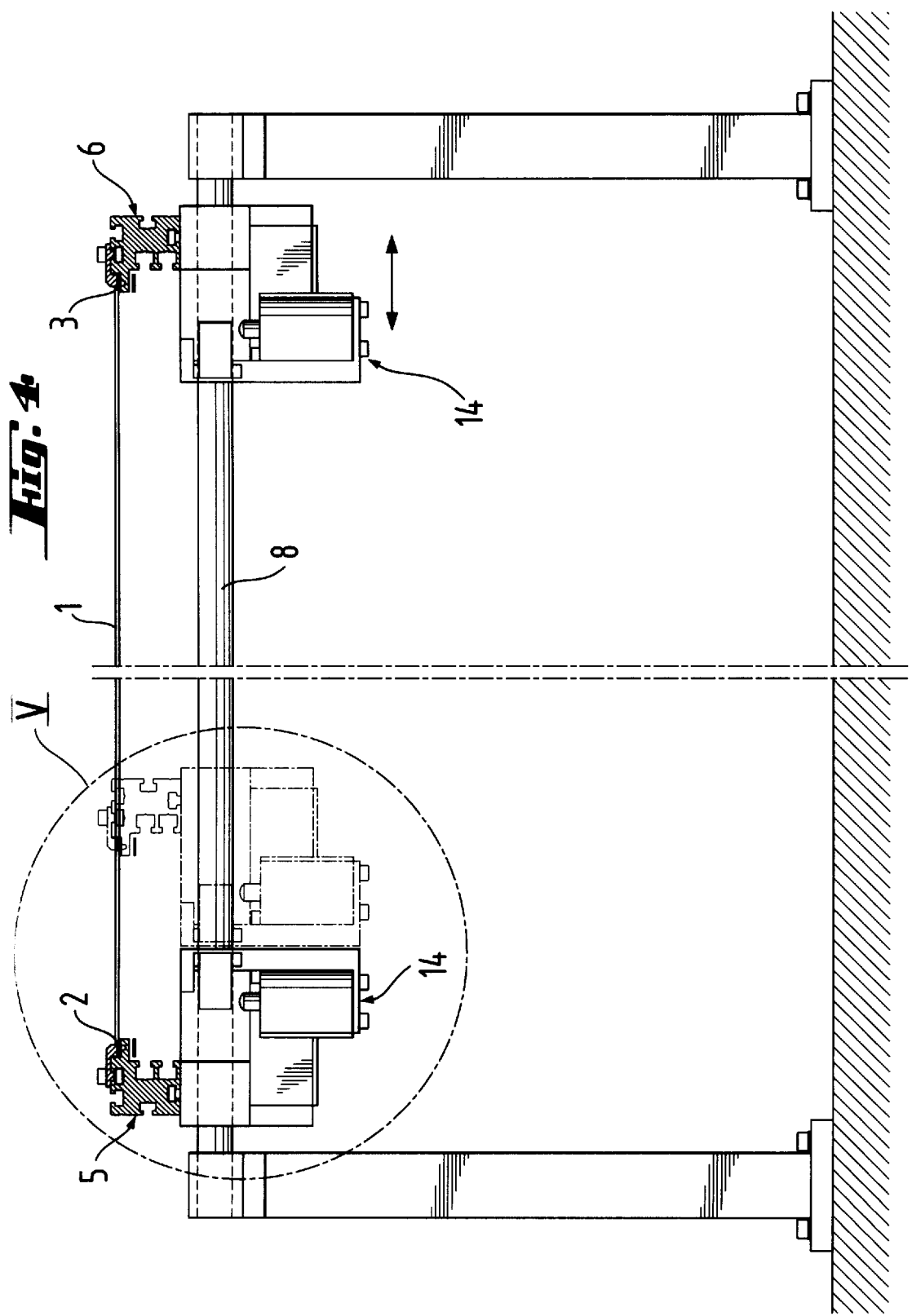
Figure 5:
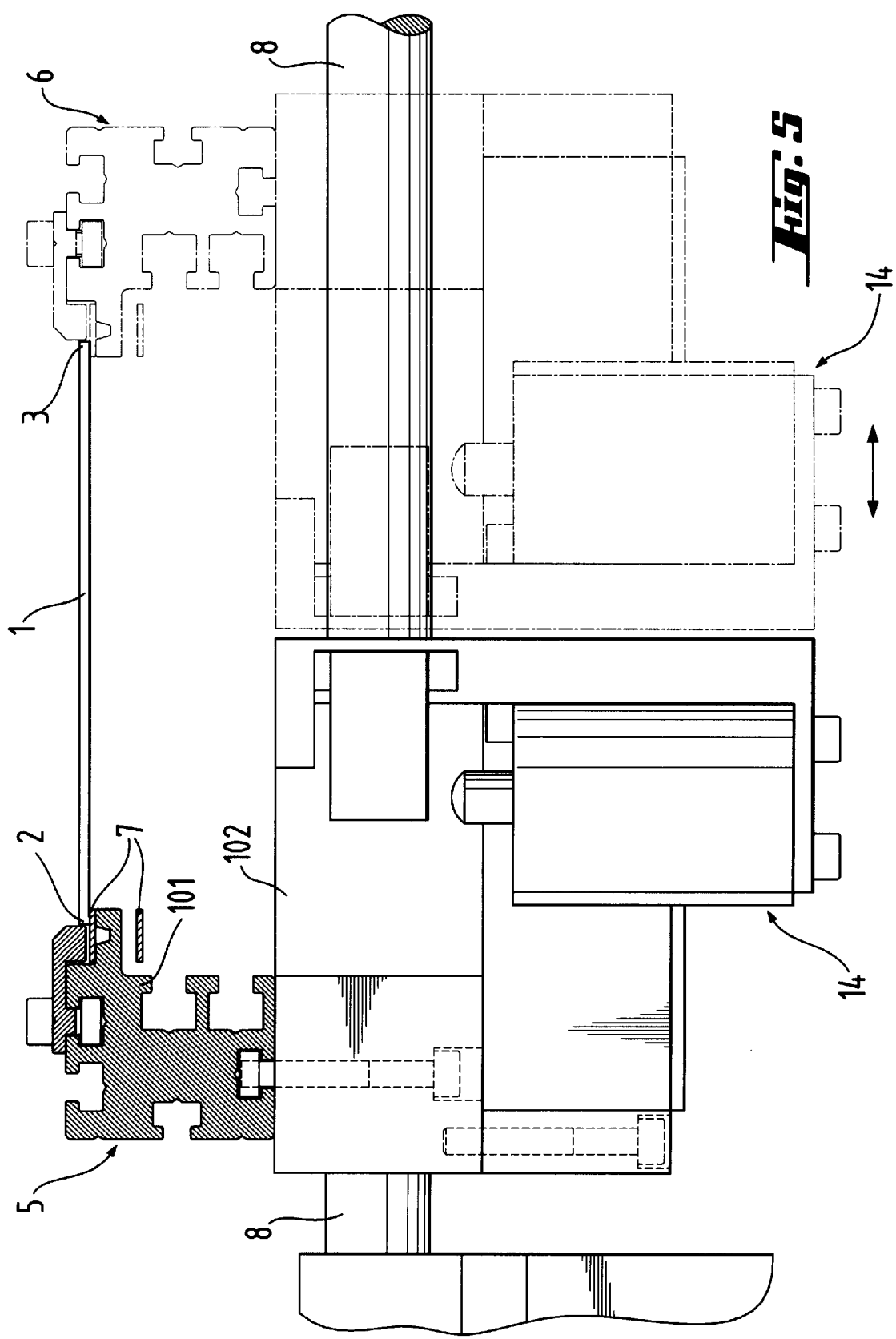
Figure 9:
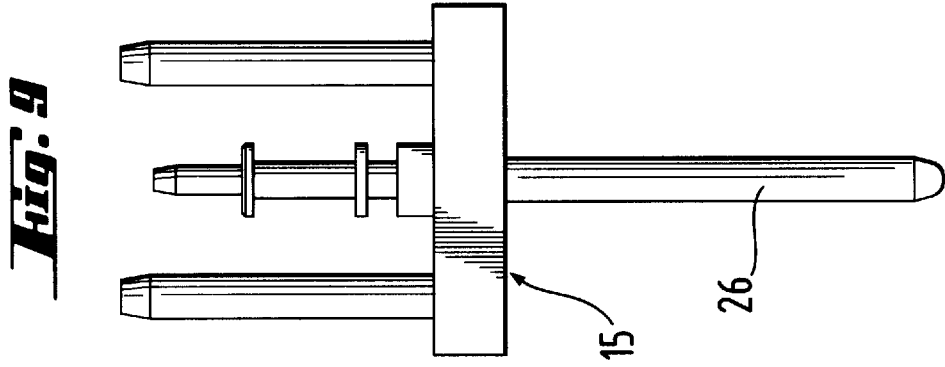
Figure 8:
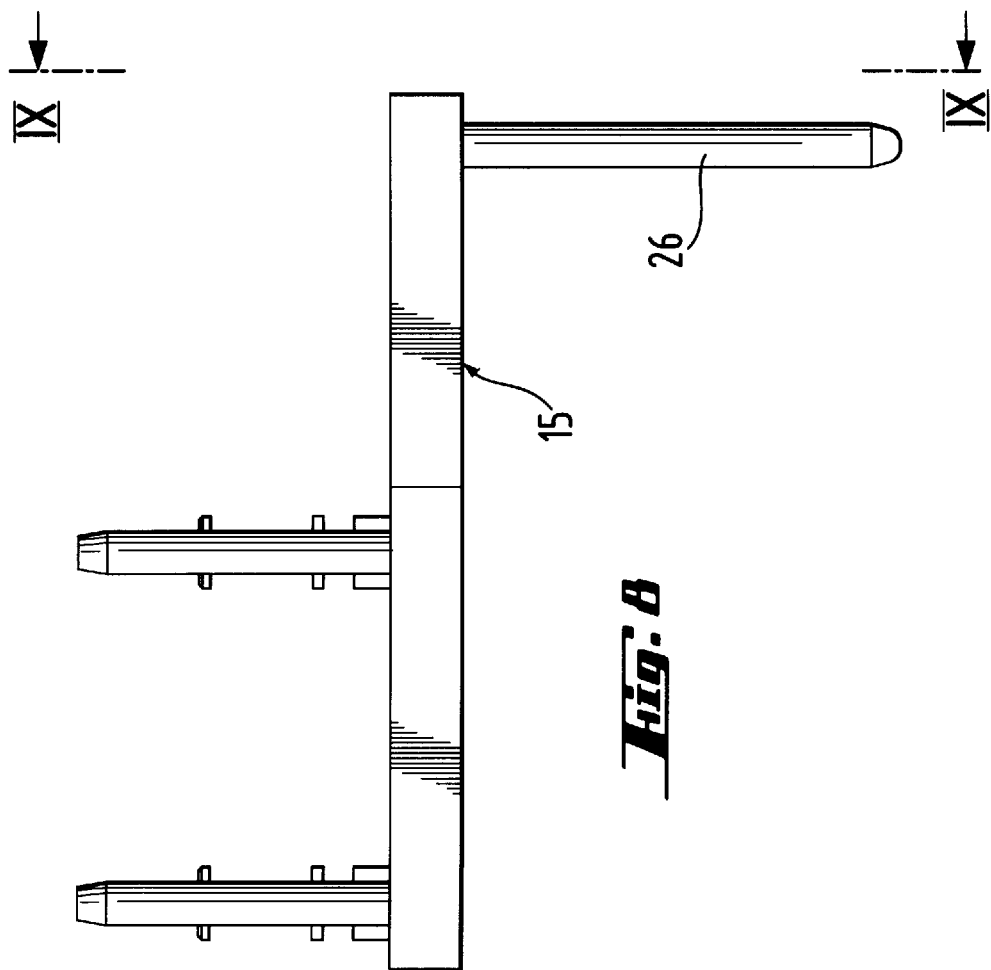

In the following, the invention is described in detail by the aid of embodiment examples by referring to the attached drawing, in which FIG. 1 presents an embodiment of the apparatus of the invention in a general, diagrammatic front view, FIG. 2 presents the apparatus of FIG. 1 in diagrammatic top view, FIG. 3 presents the conveyor and centering device of the apparatus in FIG. 1 and 2 in a somewhat magnified form, FIG. 4 presents section IV—IV of FIG. 3, further magnified, FIG. 5 presents a (V) detail of FIG. 4, further magnified, FIG. 6 presents a magnified section VI—VI of FIG. 3, FIG. 7 presents a side view of the gripper in the embodiment in FIG. 1, in which a transferring tool is so fastened that it can be detached and replaced, FIG. 8 presents a transferring tool provided with standard quick-grip elements, FIG. 9 presents the transferring tool in FIG. 8 as seen from direction IX—IX, FIG. 10 presents a magnified top view of the centering device of the apparatus in FIGS. 1–3.

Figure 11:
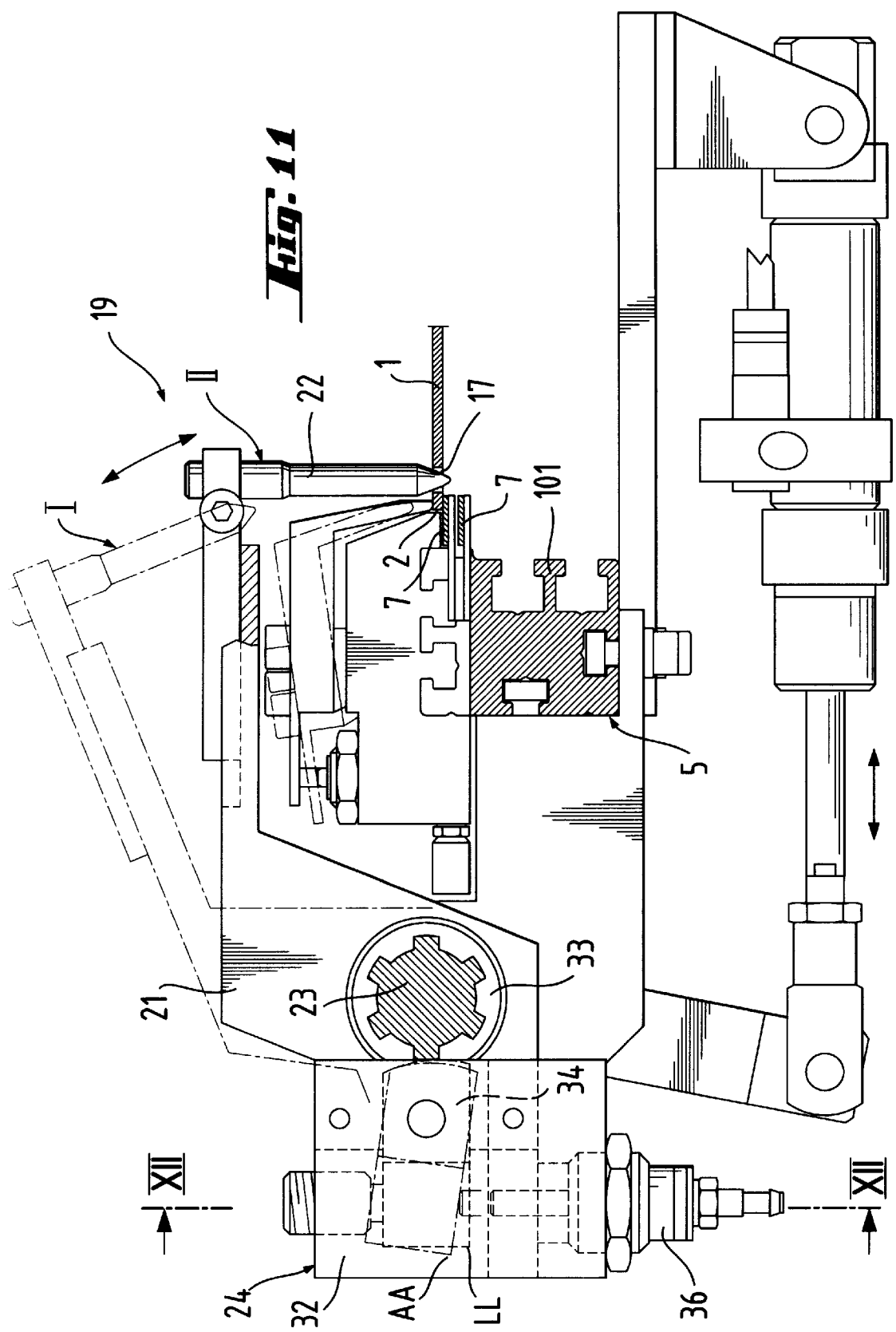

FIG. 11 presents section XI—XI of FIG. 10, and

FIG. 12 presents section XII—XII of FIG. 11.

FIG. 1 shows a front view of a robot cell for automatic execution of different operations in the fabrication of circuit boards. In the example depicted, the robot cell is provided with a servo-controlled milling unit 100 placed below the conveyor track aned designed to cut grooves in the circuit board to allow e.g. pieces of different shapes to be detached from it. The invention described below can equally well be applied to any corresponding robot cell provided with a transporter and a robot of a given type. Such cells include e.g. placement cells, in which components are placed on a circuit board, milling cells, in which circuit boards are milled to make grooves and/or holes in them, soldering cells, in which components are soldered onto a circuit board, and pinning cells, in which components are pinned onto a circuit board.

A typical circuit board 1, depicted in FIG. 2 as being carried by a conveyor 4 (see also FIGS. 4 and 5), has two parallel opposite edges 2, 3, the distance between which determines the transverse width W of the circuit board. In addition, the circuit board is provided with centering noles 17, 18 placed at a distance from each other in a direction perpendicular to the widthwise direction. Circuit boards corresponding to different products my differ from each other in respect of board width W and the positions of the centering holes 17 and 18.

The robot cell is provided with a conveyor 4, whose function is to bring the circuit board to an exact position where it is possible to perform e.g. a milling operation on it, as mentioned above. The conveyor 4 is shown in FIG. 1 in side view and in FIG. 2 and 3 in top view.

The conveyor 4 comprises two parallel conveyor halves 5, 6 laid in the conveying direction of the conveyor. Each has an endless traction element 7, such as a conveyor belt (see FIG. 5), which is in tractive contact with the edges 2, 3 of the circuit board to convey the circuit board. Due to the structure of the circuit board and the operations to be performed on it, a conveyor engaging the circuit board by its edges 2 and 3 is used.

FIG. 3, the sectional view in FIG. 4 and the detail illustration; in FIG. 5 clearly show the structure of the conveyor 4 and its transverse guide bars 8, 9. The guide bars 8, 9 are transversely and fixedly attached to the fixed frame of the conveyor. The conveyor half 5, 6 comprises a profiled beam 101 laid in the conveying direction of the conveyor and attached to a slide runner 102 moving along the guide bar 8, 9 (see FIG. 5).

Guided by these first guide bars 8, 9, the conveyor halves 5 and 6 can be moved in a direction perpendicular to the conveying direction while remaining parallel to each other, so that the width of the conveyor 4 can be adjusted to match the width W of the circuit board under fabrication.

As is further shown in FIGS. 1 and 2, disposed above the conveyor 4 there is an automatic three-dimensional portal robot 10 for the handling of circuit boards 1 and/or different tools 12 and/or for the execution of various fabrication operations. Therefore, the robot is provided with a gripper 11 and tools 12, which can be automatically gripped and manipulated by the gripper 11.

FIG. 7 presents a possible gripper 11, which is provided with a servo motor 103 and an automatic system for changing the tool 12 as well as quick-grip elements 104 for this purpose. Using a ball screw/nut mechanism 107, the servo motor 103 drives a pair of jaws 105, 106 to move them towards and apart from each other. The tool 12, 15 is fastened to the jaw by means of the quick-grip elements 104.

The robot additionally comprises a control unit 13, ouch as a computer, for controlling the functions of the devices comprised in the apparatus, e.g. the conveyor 4, transfer gear 10 and gripper 11, in accordance with a specified code, such as a computer program.

As shown in FIGS. 3–6, to permit the conveyor 4 of the robot cell to be adapted to different circuit board widths, the apparatus comprises a first set of locking elements 14 for locking the conveyor halves 5, 6 automatically in position relative to the first guide bars 8, 9. The locking elements 14 are driven into a locked state and into a released state in accordance with the specified code run by the control unit 13. The structure of the locking elements 14 has been described above in greater detail by referring to FIG. 6.

For the adaptation of the width of the conveyor 4, additionally a transferring tool 15 as illustrated by FIGS. 2 and 9 is needed. The tool is designed to be manipulated by the gripper 11 in. FIG. 7 in accordance with the specified code run by the control unit 13. The transferring tool 15 comprises a pin 26.

As shown in FIG. 3, the first lug element 16 is disposed in the conveyor half 5, 6 and fitted to be gripped by the transferring tool 15 to move the conveyor half 5, 6 to a position defined by the specified code run by the control unit so as to adapt the conveyor to the width W of the circuit board. The first lug element is a cut-out, hole or the like, fitted to receive the end of the pin 26.

FIG. 6 presents a more detailed illustration of the structure of the first set of locking elements 14. The first set of locking elements 14 comprises a lock body 27, which is attached to a conveyor half 5, 6 or to its slide runner 102. The lock body 27 or the slide runner 102 is provided with a through hole 28 to receive a first guide bar 8, 9. Moreover, the locking elements 14 comprise a first locking lever 29 pivoted on the first lock body 27 so that it can be turned between two positions. These positions are a locking position L (depicted with a solid line in FIG. 6), in which the first locking lever 29 is in locking contact with the first guide bar 8, 9, and a release position A (depicted with a dotted broken line in FIG. 6), in which the first locking lever is released from locking contact with the first guide bar. Further, the first set of locking elements 14 comprises a first spring 30, which is fitted to continuously press the first locking lever 29 towards the locking position. L. In addition, the locking elements 14 comprises a first power means 31, which is a pneumatic cylinder arranged to be activated according to the specified code run by the control unit so that it acts against the spring force of the first spring 30 to turn the locking lever 29 to the release position A so as to allow the position of the conveyor half 5, 6 and the width of the conveyor 4 to be adjusted.

Referring to FIG. 3 and FIGS. 10–12, the centering device 19 comprised in the apparatus will now be described. The function of the centering device is to position and fix the circuit board on the conveyor 4 by means of the centering holes 17 and 18 in the circuit board substantially accurately in a specified location to allow a given fabrication operation to be carried out.

The centering device 19 can be adjusted by means of the transferring tool 15 of the transfer gear 10, shown in FIGS. 8 and 9, according to the specified code run by the control unit 13, to a size corresponding to the distance l between the centering elements 17, 13 of the circuit board.

As shown in FIGS. 10–12, the centering device 19 comprises two concentrators 20, 21, which are connected to one 5 of the conveyor halves. Each concentrator 20, 21 has a pin 22 or the like which can be moved between two positions. These positions are a rest position I, in which the pin 22 is above the conveyor at a distance from the level of the circuit board, and a centering position II, in which the pin is in a centering hole 17, 18. Further, the centering device 19 comprises a second guide bar 23, along which the concentrator 20 or 21 can be moved in the conveying direction of the conveyor to allow the distance between the concentrator pine 22 to be adjusted to make it correspond to the distance between the centering holes 17, 18 in the circuit board 1. In this case, only the left-hand concentrator 21 is moved along the guide bar 23, the right-hand concentrator being fixedly attached to the guide bar 23. Furthermore, the centering device 19 comprises a second set of locking elements 24 designed to automatically lock the concentrator 20, 21 in position on the second guide bar 23 and, correspondingly, to release it, in accordance with the specified code run by the control unit 13. In addition, the centering device 19 comprises a second lug element 25, which is a cut-out or a hole provided in the concentrator and fitted to be gripped with the transferring tool 15 to move the concentrator 21 (or 20) to a position defined by the specified code run by the control unit to adapt the centering device so as to match the distance l between the centering holes 17, 18 in the circuit board.

Referring again to FIG. 1, product-specific information about the required width of the conveyor 4 in relation to the width of the circuit board and about the locations of the centering holes and pins may be stored in the same file in the computer of the control unit 13 as other product-specific parameters for the robot. The operator of the machine can inform the program of the control unit 13 about a change of product, whereupon the robot carries out the required adjustments of the conveyor 4 and the centering device 19. The apparatus may be provided with a detector 37, e.g. a bar code reader, which automatically recognizes a code, such as a bar code, provided on the circuit board 1 and containing data giving the width L of the circuit board 1 and/or the locations of the centering holes 17, 18. This information can also be obtained by using a detector employing a method based on a vision system, e.g. a camera designed for the recognition of visual shapes, in which case the circuit board 1 need not be provided with special code markings.

In the following, referring to FIGS. 11 and 12, the structure of the second set of locking elements 24 will be described. The structure of the second set of locking elements 24 substantially corresponds to the structure of the first set of locking elements 14 used for the locking of the conveyor halves 5, 6. The second set of locking elements 24 comprises a lock body 32, which is attached to the concentrator 20, 21 and has a second guide element 33 to receive the second guide bar 23. Further, the second set of locking elements 24 comprises a second locking lever 34 pivoted on the lock body so that it can be turned between two positions, a locking position LL in which the locking lever is in locking contact with the second guide bar 23, and a release position AA in which the locking lever in released from locking contact with the second guide bar. Furthermore, the second set of locking elements 24 comprises a second spring 35 (see FIG. 35), which is fitted to press the locking lever 34 towards the locking position LL. In addition, the second set of locking elements 24 comprises a second power means 36, which in this case is a pneumatic cylinder arranged to be activated according to the specified code run by the control unit 13 so that it will act against the spring force of the second spring 35 to turn the second locking lever to the release position AA so as to allow the position of the concentrator 20, 21 to be adjusted.

The invention is not restricted to the examples of its embodiments described above, but many variations care possible within the framework of the inventive idea defined by the claims.

I claim:

1. Apparatus for automatic execution of operations in the fabrication of a circuit board or similar board, the circuit board having two opposite edges parallel to each other, and a separation distance from each other defining a transverse width of the circuit board, the apparatus comprising:

a conveyor having two parallel conveyor halves laid in a conveying direction of the conveyor, each conveyor half provided with and endless traction element for tractive contact with the edges of the circuit board to move the circuit board, the conveyor halves, guided by a first set of guide bars, being movable in a direction transverse to the conveying direction while remaining parallel to each other so as to permit adjustment of a width of the conveyor;

an automatic transfer gear movable in three dimensions, disposed above the conveyor to handle the circuit boards and to carry out fabrication operations, the transfer gear being provided with a gripper;

tools, including a transferring tool, automatically grippable and manipulateable by the gripper of the transfer gear;

a control unit to control functions of the apparatus in accordance with a specified code;

a first set of locking elements to lock at least one of the conveyor halves automatically in position relative to the first guide bars, and to release the at least one of the conveyor halves in accordance with release control signals received from the control unit; and a lug element provided in the at least one of the conveyor halves and grippable by the transferring tool to move the at least one of the conveyor halves to a position in response to positioning signals received from the control unit so as to adapt the conveyor to a width corresponding to the width of the circuit board.

2. Apparatus as defined in claim 1, wherein the apparatus is provided with a centering device for positioning the circuit board in cooperation with centering elements of the circuit board to keep the circuit board substantially accurately in a specified location to allow a fabrication operation to be carried out, and the centering device is adjustable by the transferring tool of the transfer gear in response to adjusting control signals received from the control unit to match a distance between the centering elements on the circuit board.

3. Apparatus as defined in claim 2, wherein and the centering device comprises:

two concentrators connected to one of the conveyor halves, each concentrator comprising a pin movable between a rest position above the conveyor at a distance from the level of the circuit board, and a centering position in a centering hole of the circuit board;

a second guide bar, along which the concentrator is moveable in a conveying direction of the conveyor so as to adjust a distance between the concentrator pins to correspond to a distance between centering holes in the circuit board;

a second set of locking elements to automatically lock the concentrator in position on the second guide bar and to release the second guide bar in accordance with control signals received from the control unit; and a second lug element provided in the concentrator and grippable by the transferring tool to move the concentrator in response to concentrator positioning signals received from the control unit to adapt the centering device so as to match the distance between the centering holes in the circuit board.

4. Apparatus as defined in claim 3, wherein the transferring tool comprises a tool pin; and one of the first lug element and the second lug element is recessed to receive an end of the tool pin.

5. Apparatus as defined in claim 1, wherein the first set of locking elements comprises a first lock body attached to one of the conveyor halves and having a first guide element to receive one of the first guide bars, a first locking lever pivoted on the first lock body so as to be turnable between a locking position with the first locking lever in locking contact with the one of the first guide bars, and a release position with the first locking lever released from locking contact with the one of the first guide bars, a first spring fitted to press the first locking lever towards the locking position, and a first power means activatable in response to activation signals received from the control unit so as to act against a spring force of the first spring to turn the locking lever to the release position to allow a position of the one of the conveyor halves and the width of the conveyor to be adjusted.

6. Apparatus as defined in claim 3, wherein the second set of locking elements comprises a second lock body attached to one of the concentrators and having a second guide element to receive the second guide bar, a second locking lever pivoted on the second lock body so as to be turnable between a locking position with the second locking lever in locking contact with the second guide bar, and a release position with the second locking lever released from locking contact with the second guide bar, a second spring fitted to press the locking lever towards the locking position, and a second power means activatable in response to second power means activation signals received from the control unit so as to act against a spring force of the second spring to turn the second locking lever to the release position to allow the position of the one of the concentrators to be adjusted.

7. Apparatus as defined in claim 2, further comprising a detector to detect one of a) a size of the circuit board and b) locations of the centering elements and to instruct the control unit to adjust one of the conveyor width and the centering device in response to the measured one of size and locations.

8. Apparatus as defined in claim 7, wherein the circuit board is provided with a code to indicate one of a) the width of the circuit board and b) the locations of the centering elements and the detector is a code reader.

9. Apparatus as defined in claim 1, wherein the transfer gear is a portal robot.

10. Apparatus as defined in claim 1, wherein the apparatus further comprises one of a placement cell for placing components on a circuit board; a milling cell for milling one of grooves and holes in a circuit board; a soldering cell for soldering components onto a circuit board; and a pinning cell for pinning components onto a circuit board.

* * * * *